(12) United States Patent
Donohue et al.

(10) Patent No.: US 6,860,975 B2
(45) Date of Patent: Mar. 1, 2005

(54) BARRIER LAYER AND METHOD OF DEPOSITING A BARRIER LAYER

(75) Inventors: Hilke Donohue, Vale of Glamorgan (GB); Stephen Robert Burgess, Gwent (GB)

(73) Assignee: Trikon Technologies Limited, Newport (GB)

( * ) Notice: Subject to any disclaimer, the term of this patent is extended or adjusted under 35 U.S.C. 154(b) by 0 days.

(21) Appl. No.: 10/367,850

(22) Filed: Feb. 19, 2003

(65) Prior Publication Data

US 2003/0162391 A1 Aug. 28, 2003

Related U.S. Application Data

(60) Provisional application No. 60/391,974, filed on Jun. 28, 2002.

(30) Foreign Application Priority Data

Feb. 28, 2002 (GB) .............................. 0204694

(51) Int. Cl.[7] .............................. C23C 14/34
(52) U.S. Cl. ................ 204/192.3; 204/192.22
(58) Field of Search .................. 204/192.22, 192.3

(56) References Cited

U.S. PATENT DOCUMENTS

| | | | |
|---|---|---|---|
| 6,139,699 A | 10/2000 | Chiang et al. | 204/192.15 |
| 6,140,231 A | 10/2000 | Lin et al. | 438/653 |
| 6,229,211 B1 | 5/2001 | Kawanoue et al. | 257/751 |

FOREIGN PATENT DOCUMENTS

| | | | |
|---|---|---|---|
| EP | 0 875 924 A2 | 4/2002 | H01L/21/285 |
| WO | WO 99/53114 | 10/1999 | C23C/14/34 |
| WO | WO 03/072846 A1 | 9/2003 | C23C/14/06 |

OTHER PUBLICATIONS

S.R. Burgess et al., "Evaluation of Ta and TaN–based Cu diffusion barriers deposited by Advanced Hi–Fill (AHF) sputtering onto blanket wafers and high aspect ratio structures", Microelectronic Engineering, 2002 Elsevier Science B.V., pp. 307–313.

Momtchil Stavrev et al., "Crystallographic and morphological characterization of reactively sputtered Ta, Ta–N and Ta–N–O thin films", Thin Sold Films, 1997 Elsevier Science S.A., pp. 79–88.

Bhola Mehrotra et al."Properties of direct current magnetron reactively sputtered TaN", Jornal of Vacuum Science & Technology/Section B 5, (1987)Nov./Dec., No. 6, pp. 1736–1740.

A.Z. Moshfegh et al., "Bias sputtered Ta modified diffusion barrier in Cu/Ta (Vb)/Si(111) structures", Thin Solid Films, 2000 Elsevier Science S.A., pp. 10–17.

Philip Cantanla et al., "Low resistivity body–centered cubic tantalum thin films as diffusion barriers between copper and silicon", Journal of Vacuum Science & Tehnology A 10 (1992) Sep./Oct., No. 5, New York, pp. 3318–3321.

Kyung–Hoon Min et al., "Comparative study of tantalum and tantalum nitrides (Ta2N and TaN) as diffusion barrier for Cu metallization",J. Vac. Sci. Technol. b14(5), Sep./Oct. 1996, pp. 3263–3269.

Primary Examiner—Steven Versteeg
(74) Attorney, Agent, or Firm—Volentine Francos & Whitt, PLLC

(57) ABSTRACT

A barrier layer is deposited on a substrate having a recess by sputtering tantalum in a nitrogen atmosphere. A flow of the nitrogen is selected to deposit mixed phase bcc/βTa, and sputter ions are sufficiently energetic to cause re-sputtering of deposited material from the base of the recess to its sidewall or sidewalls.

12 Claims, 7 Drawing Sheets

Resistivity and phase formation vs $N_2$ flow for AHF Ta(N) deposition.

theta/2 theta XRD results for Ta(N) barriers as a function of $N_2$ flow after 480 deg C vacuum anneal for 40 mins.

β Ta U=-200V, 1:45 etch

β Ta U=-50V, 1:45 etch

Results of HF dip on β Ta, effect of DC bias.

β Ta mixed bcc/β Ta

Ta(N)$_x$

Results of HF dip on various phases of Ta(N) deposited into via structures.
(U=-200V, 5 min etch)

β Ta
~50% sidewall coverage mixed bcc/β Ta
~50% sidewall coverage

Ta(N)$_x$
~30% sidewall coverage

Sidewall coverage for β Ta, mixed bcc/β Ta and high N$_2$ flow Ta(N) in trench structures (all U=−200V).

BARRIER LAYER AND METHOD OF DEPOSITING A BARRIER LAYER

CROSS-REFERENCE TO RELATED APPLICATIONS

A claim of priority is made to U.S. provisional application Ser. No. 60/391,974, filed Jun. 28, 2002, and to British patent application No. 0204694.4, filed Feb. 28, 2002, the contents of both applications being incorporated herein by reference in their entireties.

BACKGROUND OF THE INVENTION

1. Field of the Invention

This invention relates to a barrier layer and to a method of depositing a barrier layer on a substrate having a recess.

2. Description of the Related Art

Ta and Ta(N) films deposited by physical vapour deposition (PVD), are widely used as diffusion barriers in Cu metallisation systems, in, for example semiconductor devices. A great deal of research has been done on the formation of various Ta(N) phases as the amount of $N_2$ incorporated into the Ta structure is increased. The material systems which are formed are complex, varying from films that are best described as $N_2$ in a solid solution with Ta to polycrystalline phases of Ta(N) such as $Ta_4N$, $Ta_2N$ and TaN. The investigations reported in the literature into the barrier properties of such layers, in their different phases, are almost all based on a blanket deposition on the field of the wafer, and little or no investigation has taken place into the properties of the barrier in the actual integrated structure when recesses, such as vias, are formed and have to be coated.

In reality, the performance in the integrated structure is an important consideration when Cu metallization is used, since Cu, unlike Al has a high diffusivity into $SiO_2$-based dielectrics. Consequently, the characteristics and integrity of the barrier materials deposited on the sidewalls of a via or trench is of significant importance in preventing the undesirable diffusion of Cu into the dielectric.

The current prior art understanding is that the best barrier layers are formed when Ta is sputter deposited in high flows of nitrogen in a mix with inert gas such as argon, but this understanding seems to be based on a comparison of the barrier layer properties on the basis of unit thickness of barrier layer without consideration for the resultant thicknesses of the different Ta(N) phases deposited on the side walls of sub-micron recesses in insulating layers.

SUMMARY OF THE INVENTION

From one aspect the invention consists in a method of depositing a barrier layer on the substrate having a recess, including sputtering tantalum in a nitrogen containing atmosphere wherein the flow of nitrogen is selected to deposit mixed phase bcc/βTa and where the sputter ions are sufficiently energetic to cause re-sputtering of deposited material from the base of the recess to its sidewall or sidewalls.

At low levels the nitrogen will be incorporated at an atomic level e.g. interstitially. At higher concentrations there will a reaction of the tantalum and nitrogen to form a tantalum nitride.

Sputtering is a process whereby target material is deposited upon a substrate by impingement of ions upon a target. Material is ejected and travels along line of sight to reach the surface of the substrate. Sidewalls of small recesses receive little or no material by this process as they are shadowed.

Re-sputtering is a process whereby a material previously deposited upon a substrate is sputtered from it under the influence of a bias voltage. The voltage to achieve sputtering is typically considered to be in excess of –70 eV (assuming singly ionised sputter gas), though the precise threshold level is depended on the mass of the sputter gas, the sputter yield of the material to be removed and its density. Given any selected voltage and sputter gas then sputter yield is a function of the material to be sputtered. The sputtered material departs from the surface under ionic bombardment following a cosine law and hence the Applicants have determined that material at the base of a recess can be re-sputtered onto the shadowed portions of the sidewalls of the recesses. Indeed, the Applicants believe that there is no other mechanism to achieve coating of the shadowed side wall portions in a pure sputter process.

Thus the Applicants have determined that, surprisingly, in an integrated regime, the more practical and efficacious barrier layer is formed by using a material which does not have the best unit thickness barrier properties when measured on a non-recessed surface. This is particulary true in high aspect ratio structures, where due to shadowing and material build up at the lip of the recess the material directly deposited on the sidewalls is thin relative to the material deposited on the base. Therefore even if a good barrier material is put onto the walls, this very thinness means that an insufficient barrier is formed. As will be explained in more detail below, what the Applicants believe occurs is that the material formed using high $N_2$ flows does not readily re-sputter, once deposited, whereas if the nitrogen flow is selected to deposit a mixed phase bcc/βTa material, the material on the base will not only re-sputter onto the sidewalls, but during that re-sputtering further nitrogen is incorporated into the material and hence the barrier quality of the layer on the sidewall is enhanced.

Put simply the Applicants have determined that surprisingly a significantly improved barrier layer can be formed in an integrated structure, by using a material which has per-unit barrier properties that are recognized as being somewhat poor in comparison to those of high nitrogen flow materials.

In a preferred embodiment the substrate is negatively biased so as to enhance re-sputtering and conveniently the substrate bias is between –70 and –500 volts and particularly between –150 and –250 volts with around –200 volts being preferred.

The resistivity of the barrier layer on the sidewalls or wall may be higher than that of the barrier layer at the base of the recess. This feature illustrates another advantage of the system in that, in one deposition step, a barrier layer of different barrier and electrical properties can be placed on different parts of the structure in a manner which tends to optimize the performance.

In any of the above arrangements the resistivity of the material of the base of the recess may be in the range of 50–150 $\mu$ohm cm.

From one aspect the invention consists in a method of depositing a barrier layer on a substrate having a recess, including sputtering Tantalum in a nitrogen atmosphere wherein the flow of nitrogen is selected to deposit mixed phase bcc/βTa and wherein the sputtered ions are sufficiently energetic to cause re-sputtering of deposited material from the base of the recess to its sidewall or sidewalls.

Although the invention has been defined above, it is to be understood it includes any inventive combination of the features set out above or in the following description.

BRIEF DESCRIPTION OF THE DRAWINGS

The invention may be performed in various ways and specific embodiments will now be described, by way of example, with reference to the accompanying drawings in which.

DETAILED DESCRIPTION OF THE PREFERRED EMBODIMENTS

To aid their investigation the Applicants evaluated barrier layers deposited onto blanket wafers (Si and thermally oxidised Si) as well as wafers patterned with via structures. The main deposition parameters investigated were nitrogen flow during reactive sputtering and the substrate bias voltage. For blanket wafer deposition film properties investigated included crystallographic structure, resistivity and barrier strength compared to Cu diffusion. For the patterned wafers an HF dip test was used to evaluate barrier sidewall material.

EXPERIMENTAL

Ta and Ta(N) films of varying nitrogen content were deposited using advanced Hi-Fill® (AHF) sputtering technology. AHF utilizes a system of variable magnetic fields and high target power density to produce a sputtered flux with a significant ionization fraction and a significant plasma density proximate the wafer surface. Applying a DC bias to the wafer gives directionality to the incoming flux thereby increasing base and sidewall coverage within high aspect ratio structures. Moreover, when high values of DC bias (−U>100V) are applied to the wafer, re-sputtering of material from the base of the structure onto the sidewalls occurs increasing sidewall coverage, an area associated with minimal step coverage. Blanket deposition was performed onto bare Si<100> substrates and patterned wafers with 3:1 AR via structures formed in TEOS. For the blanket studies films were deposited onto thermally oxidized Si. Four point probe and 2 theta XRD measurements were used to evaluate film resistivity and microstructure respectively. To test against Cu diffusion the Si/15 nm Ta(N) barrier/200 nm Cu system was investigated. Each barrier was annealed in vacuum (base pressure <10E-6 torr) between a temperature range of 380–615 deg C. for 40 mins, theta/2 theta XRD scans were performed after each anneal. For the patterned wafers 50 nm of each barrier was deposited onto outgassed rectangular samples. The samples were then subject to an HF acid dip test (1% HF solution). 1% HF acid slowly etches both Ta and Ta(N) (~0.5 nm/min) but etches in TEOS oxide much more quickly. Once the HF has broken through the barrier the acid quickly etches into the oxide which is easily detected by SEM observation. Using this method it is possible to identify areas of poor step coverage or low quality (high level of porosity/defects) material and, as a relative test, infer differences between Ta(N) barriers of varying Nitrogen content.

RESULTS AND DISCUSSION

Figure 1:
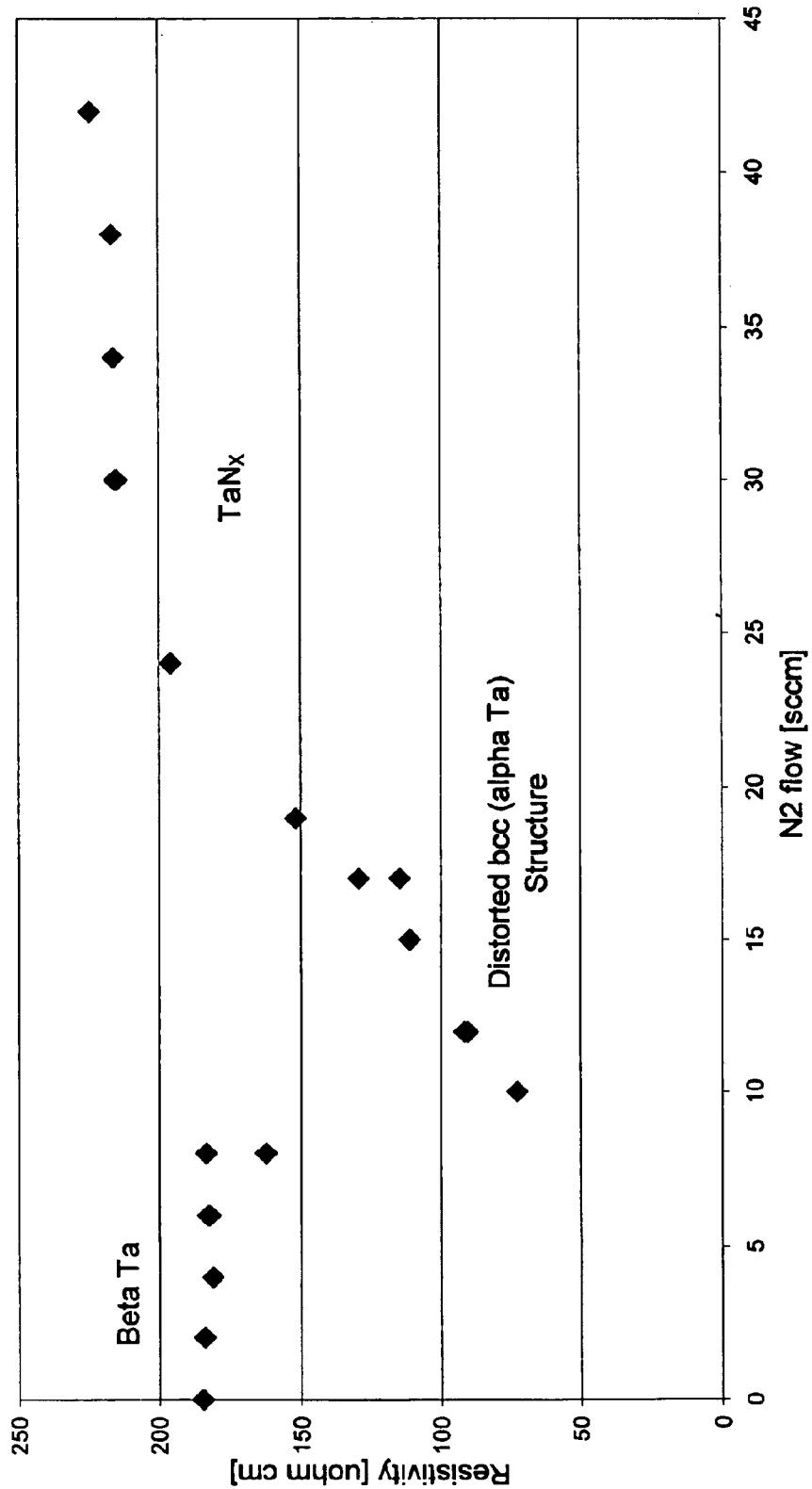
FIG. 1 is a graph of resistivity and phase formation versus $N_2$ for Advances Hi-Fill® (AHF), TaN deposition.

FIG. 1 shows the resistivity of AHF Ta(N) films as a function of the Nitrogen flow deposited onto thermally oxidized Si. For Nitrogen flows between 0 and 8 sccm or approximately up to 10% of total pressure, material of resistivity ~180 $\mu\Omega$cm is formed. XRD studies have shown that tetragonal β-phase Ta is the dominant phase in this flow range. For the Nitrogen flow in the region of 10–20 sccm or approximately 12% to 22% of total pressure, the resistivity drops to 60–100 $\mu\Omega$cm. The incorporation of small amounts of nitrogen into the Ta lattice is known to perturb the formation of bcc or α-phase Ta. However, the formation of a pure α-phase was not observed here and the material deposited is more consistent with a mixed bcc and β-phase, again this being confirmed with XRD and resistivity measurements. Higher $N_2$ flows were observed to increase the resistivity, at first linearly and then the value was found to plateau at around 220–250 $\mu\Omega$cm for $N_2$ flows of more than 30 sccm or approximately 30% of total gas pressure. The structure is probably now best described as a (distorted) bcc Ta(N)$_x$ solid solution. Equilibrium polycrystalline as-deposited TaN or $Ta_2N$ phases were not observed in the as-deposited films in this study, however it was found that crystallisation of these phases could be achieved by annealing the Si/Ta(N)$_x$/Cu structures.

Figure 2:
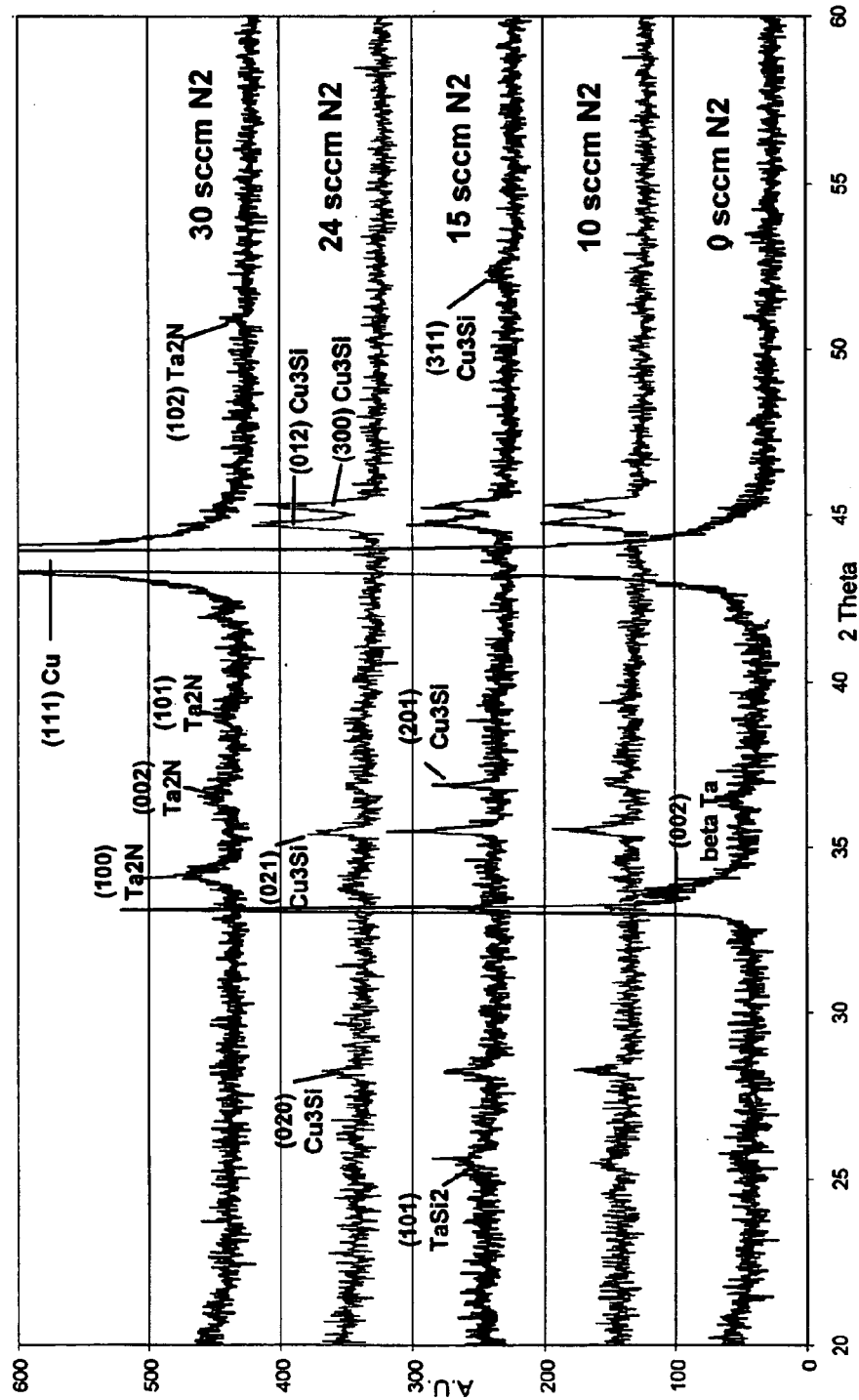
FIG. 2 is a graph showing theta/2 theta XRD results for Ta(N) barriers as a function of $N_2$ flow after 480° C. vacuum anneal for 40 minutes.

FIG. 2 shows XRD patterns of Si/15 nm Ta(N)/Cu system deposited on blanket silicon wafers after a vacuum anneal at 480° C. for 40 min. Ta(N) barrier thickness of 15 nm were deposited using different Ar/$N_2$ flow ratios. The breakdown temperature of the barrier in this case is determined by the loss of Cu(111) signal and the growth of copper and tantalum silicide peaks (predominantly $Cu_3Si$ and $TaSi_2$). The presence of $Cu_3Si$ indicates that Cu has diffused through the barrier and reacted with the underlying Si substrate whilst $TaSi_2$ peaks indicate that the barrier has reacted with the underlying Si. As previously mentioned for no Nitrogen flow the beta phase of Ta is formed. After the 480 deg C. anneal this barrier is seen to remain essentially intact showing good resistance to Cu diffusion. For intermediate $N_2$ pressures approximately (10<$N_2$<20%), mixed bcc/beta phase of Ta is formed, FIG. 1. After a 480 deg C. anneal the XRD traces is dominated by $Cu_3Si$ with small amount of $TaSi_2$, possibly indicating a failure mechanism via diffusion of Cu through the barrier and reacting with the underlying Si. In this case however, XRD is not sensitive enough to be able to distinguish the exact mechanism of failure. Thus the results indicate that the β phase of Ta is more resistant to Cu diffusion than mixed bcc/β phase. β phase Ta has a columnar polycrystalline structure whilst the sputtered bcc phase is reported to be giant grained. With this in mind it may be anticipated that the bcc phase would form a better barrier due to fewer free short circuit paths being available for Cu diffusion (free short circuit paths are channels along which Cu can easily diffuse, such as grain boundaries, dislocations, defects and microcracks). However, as previously discussed the low resistivity phase found in this work is thought to be a mixed bcc/β phase as opposed to pure bcc phase and this maybe an explanation for its particularly poor resistance to Cu diffusion.

For high $N_2$ partial pressures of ($N_2$>30%) the as-deposited films are found to be x-ray amorphous in nature. After the 480 deg C. anneal this barrier system shows no sign of $Cu_3Si$ or $TaSi_2$ formation but has undergone a phase transformation into polycrystalline $Ta_2N$. The x-ray amorphous nature of the high flow $N_2$ prior to annealing suggests a nanocrystalline (densely packed grain boundaries producing a high resistance to Cu motion) or amorphous structure that would offer minimal amount of short circuit paths and a high resistance to Cu diffusion, explaining its superior behaviour as a barrier. Further anneals showed the polycrystalline $Ta_2N$ barrier to still remain intact up to 615 deg C. on flat wafer surfaces indicating that even after undergoing phase transformation high $N_2$ content barriers are still effective against Cu diffusion.

Figure 7:
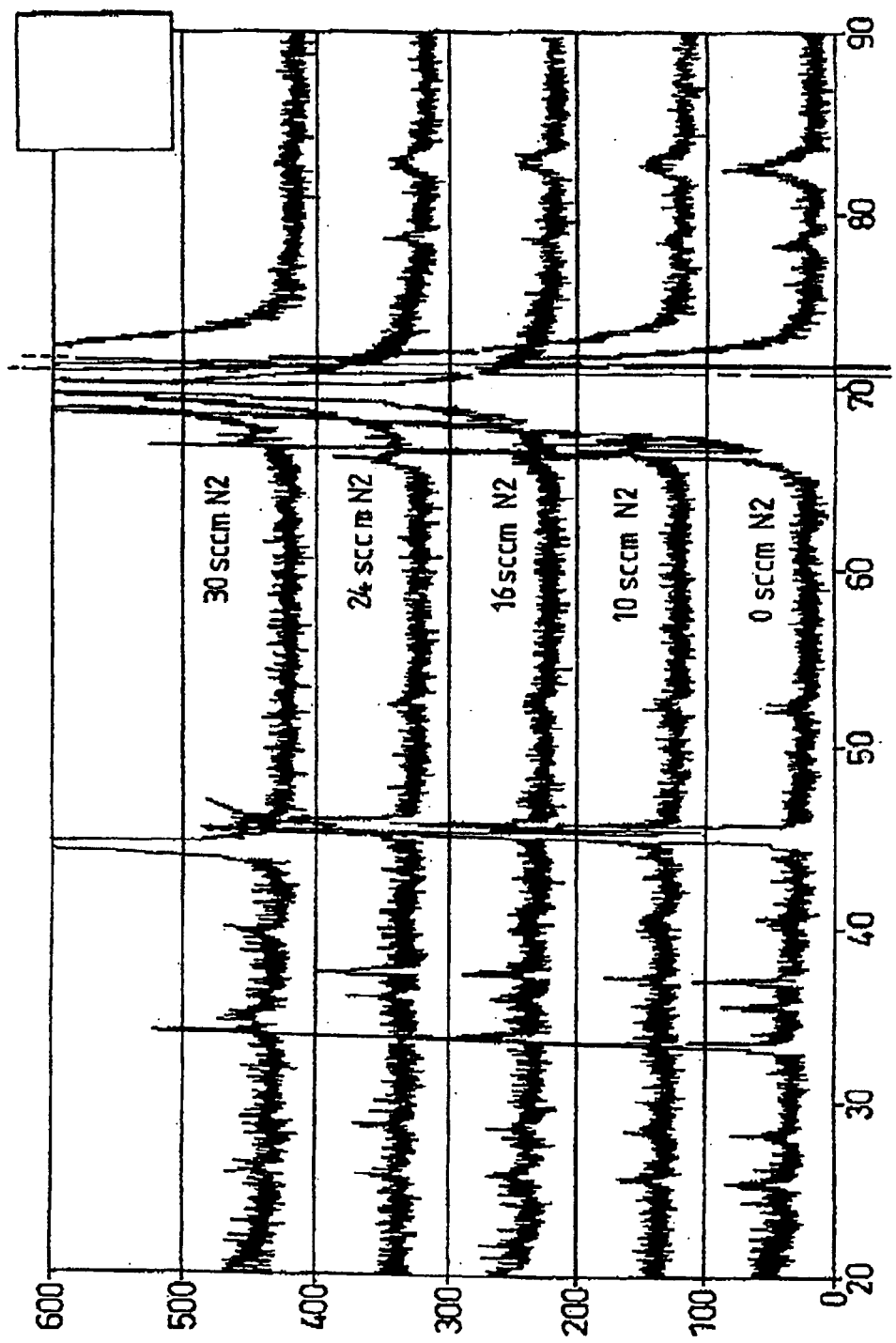
FIG. 7 is a graph showing theta/2 theta XRD results for Ta(N) barriers as a function of nitrogen flow after 615° C. vacuum anneal for 40 minutes.

FIG. 7 is a graph showing theta/2 theta XRD results for Ta(N) barriers as a function of nitrogen flow after 615° C. vacuum anneal for 40 minutes.

None of the barriers made with less flows of nitrogen survived this anneal—suggesting that the best barrier is made from a $Ta(N)_x$ type material.

Figure 6:
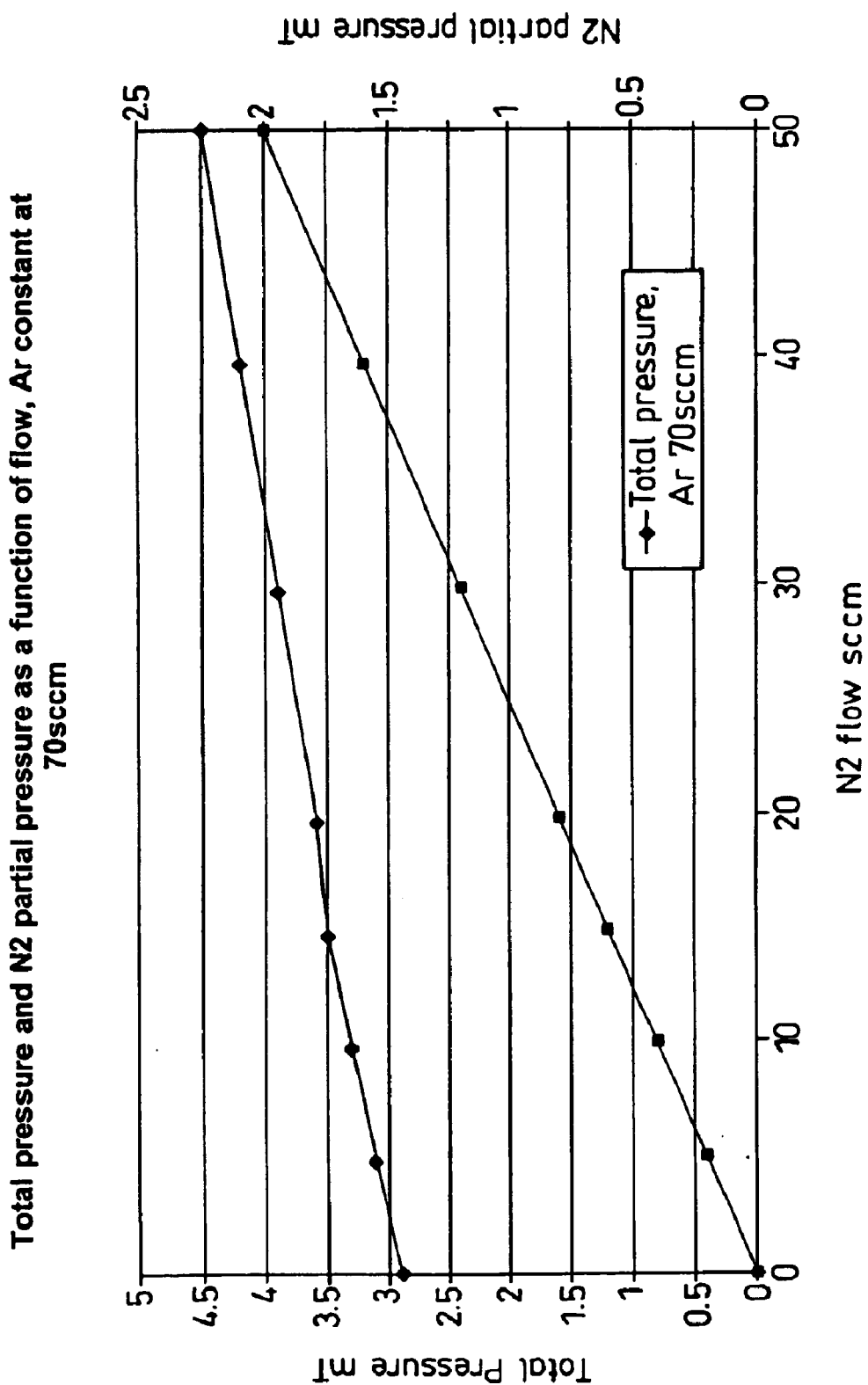
FIG. 6 shows the relationship between nitrogen flow, nitrogen partial pressure (in Argon) and total pressure.

Incidentally, FIG. 6 is provided as a graphical look-up reference showing the relationship between nitrogen flow, nitrogen partial pressure (in Argon) and total pressure. Specifically, the figure illustrates total pressure (mT) and N2 partial pressure (mT) as a function of N2 flow (sccm), with Ar constant at 70 sccm.

Figure 3:
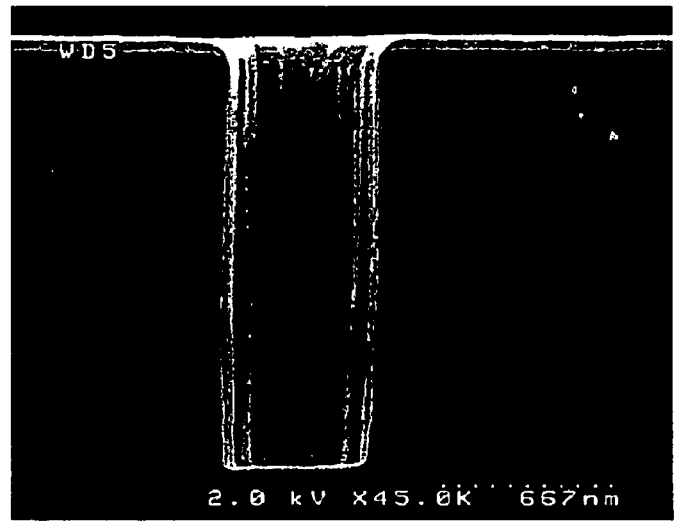
FIG. 3 are scanning electron micrographs showing the results of HF dip on Ta deposited under different bias conditions.
Figure 3:
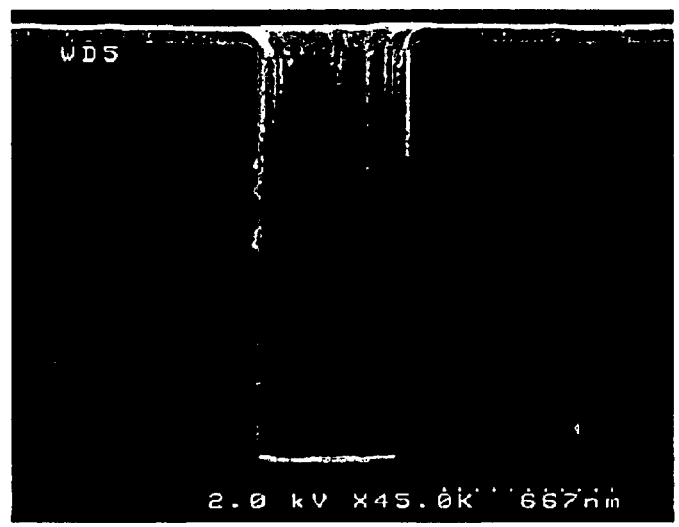

To test the effectiveness of forming a barrier using AHF in high aspect ratio structures we have adopted a barrier test using HF dip (1% HF solution). As previously mentioned a method of forming a diffusion barrier with good sidewall coverage is to re-sputter base material on to the sidewall. FIG. 3 shows the effect of DC bias on βTa deposition after HF dip test. For U=-50V minimal re-sputtering occurs ($\gamma_{yield}$=0.01 @50 eV) and the weak part of the barrier is the middle to lower region. For U=-200V ($\gamma_{yield}$=0.41 @200 eV) the barrier survives the test, showing the effectiveness of the re-sputter technique to enhance sidewall coverage. Further testing of these barriers showed the high bias sample survived the test for around three times longer than the low bias sample indicating that most of sidewall material is re-sputtered from the base.

To compare with the blanket wafer study we prepared patterned wafers with Ta(N) barriers of varying Nitrogen content (all deposited using re-sputtering bias of U=-200V). Table 1 shows the relative etch rate for blanket deposited AHF Ta(N) films in 1% HF solution as a function of Nitrogen flow.

TABLE 1

| Ta(N) Phase | N2 flow Sccm | Blanket etch rate (nm/min) in 1% HF |
| --- | --- | --- |
| β Ta | 0 | 0.63 |
| mixed bcc/β | 10–20 | 0.60 |
| High N2 $Ta(N)_x$ | >30 | 0.40 |

It can be seen that both βTa and mixed phase bcc/βTa etch at a similar rate of around 0.6 nm/min. The high Nitrogen flow $Ta(N)_x$ etches more slowly at 0.4 nm/min.

Figure 4:
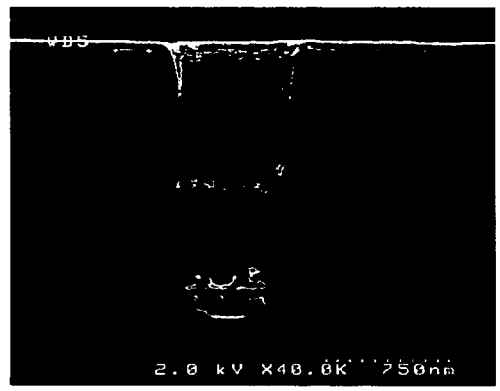
FIG. 4 shows the results of HF dip on various phases of Ta(N) deposited into via structures.
Figure 4:
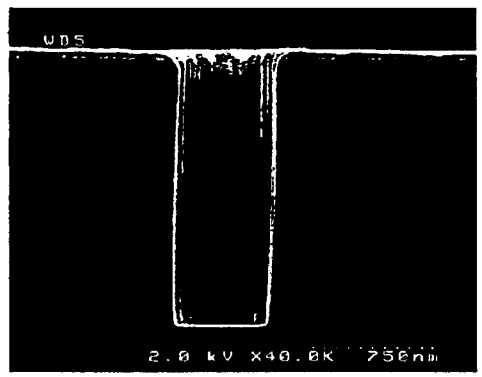
Figure 4:
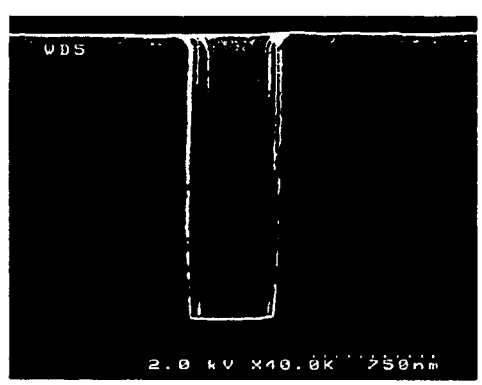
Figure 5:
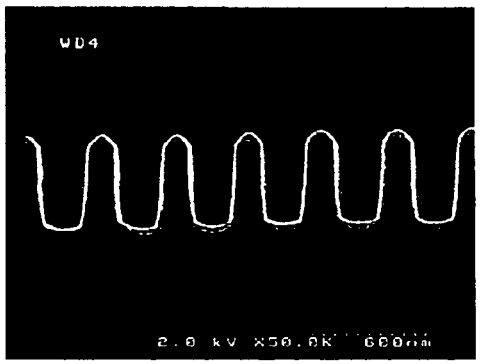
FIG. 5 illustrates sidewall coverage for βTa, mixed bcc/βTa and high $N_2$ flow Ta(N) in trench structures.
Figure 5:
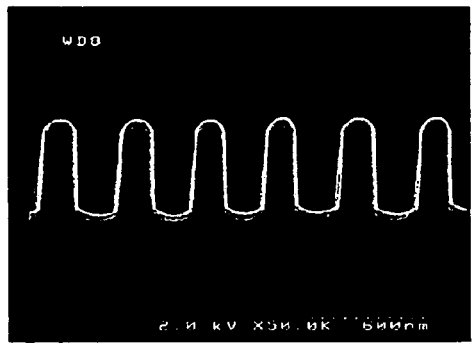
Figure 5:
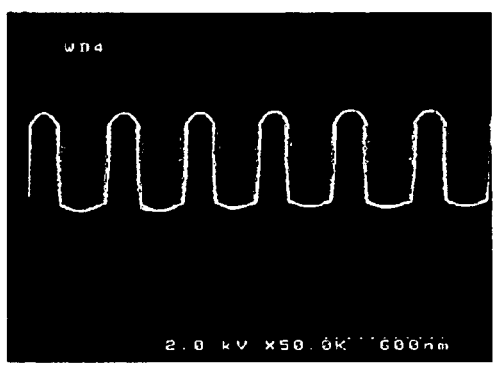

FIG. 4 shows the results of a 5 minute HF dip test for βTa, mixed phase and $Ta(N)_x$. Interestingly, the test predicts the most resistive barrier to HF dip is formed from intermediate Nitrogen partial pressure. Higher Nitrogen content film show increasingly lower resistance to the test. XRD and resistivity measurements confirmed that the intermediate Nitrogen partial pressure corresponds to the mixed bcc/β phase. According to the HF etch rate data mixed phase Ta should be one the least resistant. The poor performance of the high Nitrogen partial pressure $Ta(N)_x$ could simply be due to thinner coverage of sidewall material, even though this material is thought to be inherently a better barrier. As the Nitrogen content of the film increases it becomes more difficult to re-sputter, i.e. the sputter yield drops as more Nitrogen is incorporated. FIG. 5 shows the sidewall coverage obtained in trench type structures for zero, intermediate and high Nitrogen flows (all U=-200V). For βTa at FIG. 5(a) the sidewall coverage is approximately 50%, for mixed bcc/βTa at FIG. 5(b) the sidewall coverage is approximately 50% and for $Ta(N)_x$ at FIG. 5(c) the sidewall coverage is approximately 30%. It shows a clear decrease in sidewall coverage for high Nitrogen partial pressure. βTa has the best sidewall coverage, but the faster HF etch rate of βTa compared to high $N_2$ flow Ta(N) would explain why this barrier has also failed. However simply considering sidewall coverage and etch rate does not explain the performance of the mixed phase barrier. It should be no better than βTa since the mixed phase material has a similar HF etch rate to βTa and, according to FIG. 5, has similar sidewall coverage.

An explanation may lay in the fact that the actual sidewall material is no longer mixed bcc/β phase as was deposited in the base of the structure but more similar to $Ta(N)_x$, which has highest resistance to HF etching and Cu diffusion on blanket wafers. To rationalise this one might think of the base as re-sputtering efficiently, due to it being Ta, and forming a barrier with good sidewall coverage. The fraction of Ta that is re-sputtered deposits on the sidewall with a lower deposition rate than the main base material and reacts with a partial pressure of Nitrogen which is now sufficient to form the high resistivity Ta(N) phase. In this way the barrier maybe thought of as having a base coverage of low resistivity mixed phase bcc/βTa and an enhanced sidewall coverage of high resistivity Ta(N), with similar properties to $Ta(N)_x$. Another advantage of such a composite type barrier layer is that low resistivity Ta in the base of via structures is desirable for reducing series via resistance. Higher resistivity sidewall material is of less consequence due to it being in parallel with the main conductor material.

What is claimed is:

1. A method of depositing a barrier layer on a substrate having a recess, comprising sputtering tantalum in a nitrogen atmosphere wherein the flow of nitrogen is selected to deposit mixed phase bcc/βTa and wherein sputter ions are sufficiently energetic to cause re-sputtering of deposited material from the base of the recess to a sidewall or sidewalls of the recess.

2. The method as claimed in claim 1 wherein a nitrogen partial pressure is in the range of 10% to 30% of total pressure.

3. The method as claimed in claim 2 wherein the substrate is negatively biased.

4. The method as claimed in claim 3 wherein the substrate is negatively biased between −50 and −500 volts.

5. The method as claimed in claim 3 wherein the substrate is negatively biased at between −150 and −250 volts.

6. The method as claimed in claim 1 wherein the substrate is negatively biased.

7. The method as claimed in claim 6 wherein the substrate is negatively baised at between −50 and −500 volts.

8. The method as claimed in claim 6 wherein the substrate is negatively baised at between −150 and −250 volts.

9. The method as claimed in claim 1 wherein a resistivity of the barrier layer deposited at the base of the recess is in the range of 50 –150 $\mu$ohm cm.

10. The method as claimed in claim 1 wherein the material from the base is re-sputtered onto the sidewall or sidewalls in a nitrogen containing atmosphere.

11. A method of depositing a barrier layer on a substrate having a recess, comprising sputtering tantalum in a nitrogen atmosphere wherein the flow of nitrogen is selected to deposit mixed phase bcc/βTa and wherein sputter ions are sufficiently energetic to cause re-sputtering of deposited material from the base of the recess to a sidewall or sidewalls of the recess;

wherein the substrate is negatively biased at between −150 and −250 volts; and wherein a resistivity of the barrier layer deposited at the sidewall or sidewalls is higher than that of the barrier layer deposited at the base of the recess.

12. The method as claimed in claim 11 wherein a nitrogen partial pressure is in the range of 10% to 30% of total pressure.

* * * * *